(12) United States Patent
Noda et al.

(10) Patent No.: US 9,837,345 B2
(45) Date of Patent: Dec. 5, 2017

(54) INTERPOSER AND CIRCUIT SUBSTRATE

(71) Applicant: IBIDEN CO., LTD., Ogaki (JP)

(72) Inventors: Kota Noda, Ogaki (JP); Takema Adachi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/211,332

(22) Filed: Jul. 15, 2016

(65) Prior Publication Data
US 2017/0018494 A1 Jan. 19, 2017

(30) Foreign Application Priority Data

Jul. 17, 2015 (JP) .................................. 2015-142690
Jul. 31, 2015 (JP) .................................. 2015-151873

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4857* (2013.01); *H01L 23/49822* (2013.01);
(Continued)

(58) Field of Classification Search
CPC ......... H01L 23/49838; H01L 23/49822; H01L 23/49827; H01L 23/49894; H01L 23/49833; H01L 23/56; H01L 21/4857; H01L 2224/73265; H01L 2224/32225; H01L 2224/48227; H01L 2224/48091; H01L 2224/16235; H01L 2224/16227;
(Continued)

(56) References Cited

U.S. PATENT DOCUMENTS 6,396,710 B1 * 5/2002 Iwami ............... H01L 23/49827
174/250
6,618,267 B1 * 9/2003 Dalal .................. H01L 23/5385
257/E23.114
(Continued)

FOREIGN PATENT DOCUMENTS

JP 2004-356619 A 12/2004

*Primary Examiner* — Hoa C Nguyen
(74) *Attorney, Agent, or Firm* — Oblon, McClelland, Maier & Neustadt, L.L.P.

(57) ABSTRACT

An interposer includes an insulating plate including insulating layers and having first, second, third and fourth surfaces such that the second surface is on the opposite side of the first surface, the third surface is perpendicular to the first surface, the fourth surface is on the opposite side of the third surface, and the insulating layers are laminated on the third surface, and conductor layers formed in the insulating plate such that each conductor layer is interposed between adjacent insulating layers and includes straight conductors having first electrodes exposed from the first surface and second electrodes exposed from the second surface, respectively. The insulating layers include second insulating layers each sandwiched by adjacent conductor layers such that each second insulating layer integrally has an inter-conductor-layer insulating layer portion formed between the adjacent conductor layers and inter-conductor insulating layer portions formed between adjacent straight conductors in a respective conductor layer.

20 Claims, 8 Drawing Sheets

(51) Int. Cl.
*H01L 25/065* (2006.01)
*H01L 23/00* (2006.01)
*H01L 25/10* (2006.01)

(52) U.S. Cl.
CPC .. *H01L 23/49827* (2013.01); *H01L 23/49833* (2013.01); *H01L 23/49894* (2013.01); *H01L 23/562* (2013.01); *H01L 24/16* (2013.01); *H01L 24/48* (2013.01); *H01L 24/73* (2013.01); *H01L 25/0655* (2013.01); *H01L 25/105* (2013.01); *H01L 2224/16227* (2013.01); *H01L 2224/16235* (2013.01); *H01L 2224/48091* (2013.01); *H01L 2224/48227* (2013.01); *H01L 2224/73265* (2013.01); *H01L 2225/107* (2013.01); *H01L 2225/1023* (2013.01); *H01L 2225/1058* (2013.01); *H01L 2924/14* (2013.01); *H01L 2924/1434* (2013.01); *H01L 2924/15311* (2013.01); *H01L 2924/15331* (2013.01); *H01L 2924/3511* (2013.01); *H01L 2924/3512* (2013.01)

(58) Field of Classification Search
CPC ....... H01L 2924/15311; H01L 2924/14; H01L 2924/1434; H01L 2924/00012; H01L 2924/15331; H01L 2924/3511; H01L 2924/3512; H01L 2924/00014; H01L 24/16; H01L 24/48; H01L 24/73; H01L 25/105; H01L 25/0655; H01L 2225/1023; H01L 2225/1058; H01L 2225/107
See application file for complete search history.

(56) References Cited

U.S. PATENT DOCUMENTS

| | | | |
|---|---|---|---|
| 2006/0001179 A1* | 1/2006 | Fukase | H01L 23/147 257/778 |
| 2011/0095414 A1* | 4/2011 | Sasaki | H01L 21/56 257/692 |
| 2011/0285023 A1* | 11/2011 | Shen | H01L 24/03 257/773 |
| 2012/0074585 A1* | 3/2012 | Koo | H01L 21/486 257/774 |
| 2012/0126427 A1* | 5/2012 | Sasaki | H01L 21/76232 257/777 |
| 2014/0251669 A1* | 9/2014 | Manusharow | H01L 23/13 174/260 |
| 2014/0293563 A1* | 10/2014 | Loo | H05K 1/141 361/767 |
| 2015/0061101 A1* | 3/2015 | Le | H01L 25/0655 257/676 |
| 2015/0171024 A1* | 6/2015 | Choi | H01L 24/97 257/774 |

\* cited by examiner

FIG. 1A
FIG. 1B
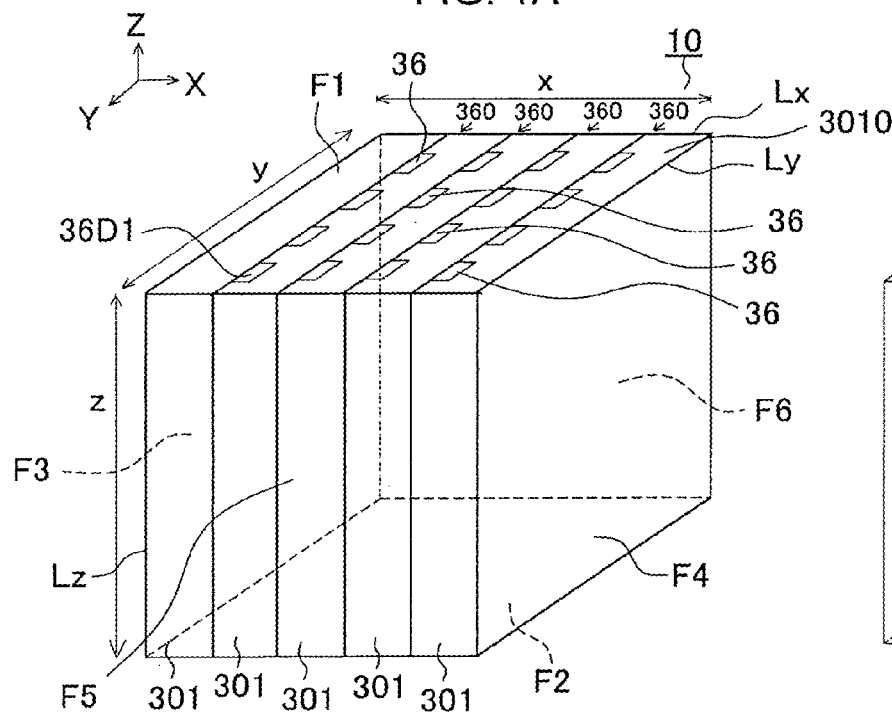
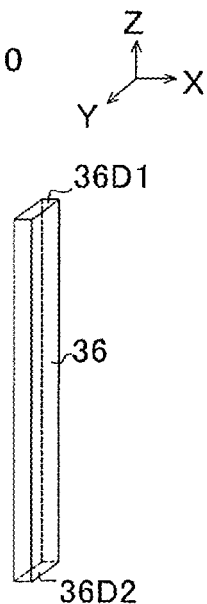
FIG. 1C
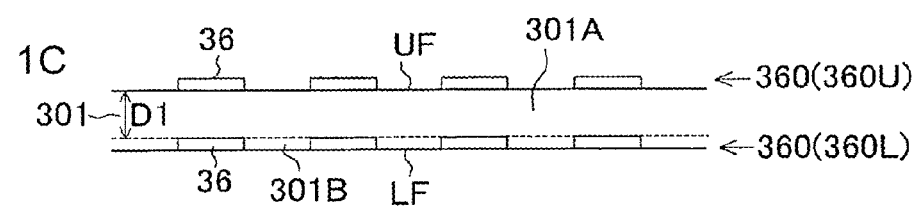
FIG. 1D
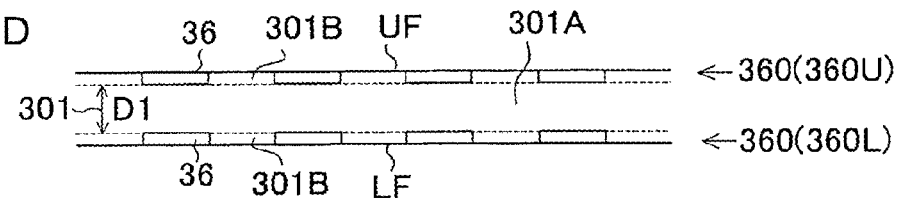
FIG. 1E
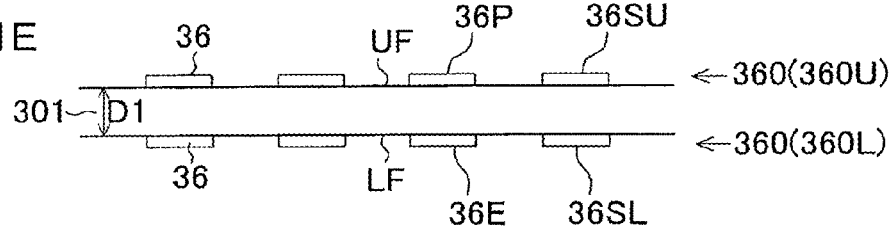

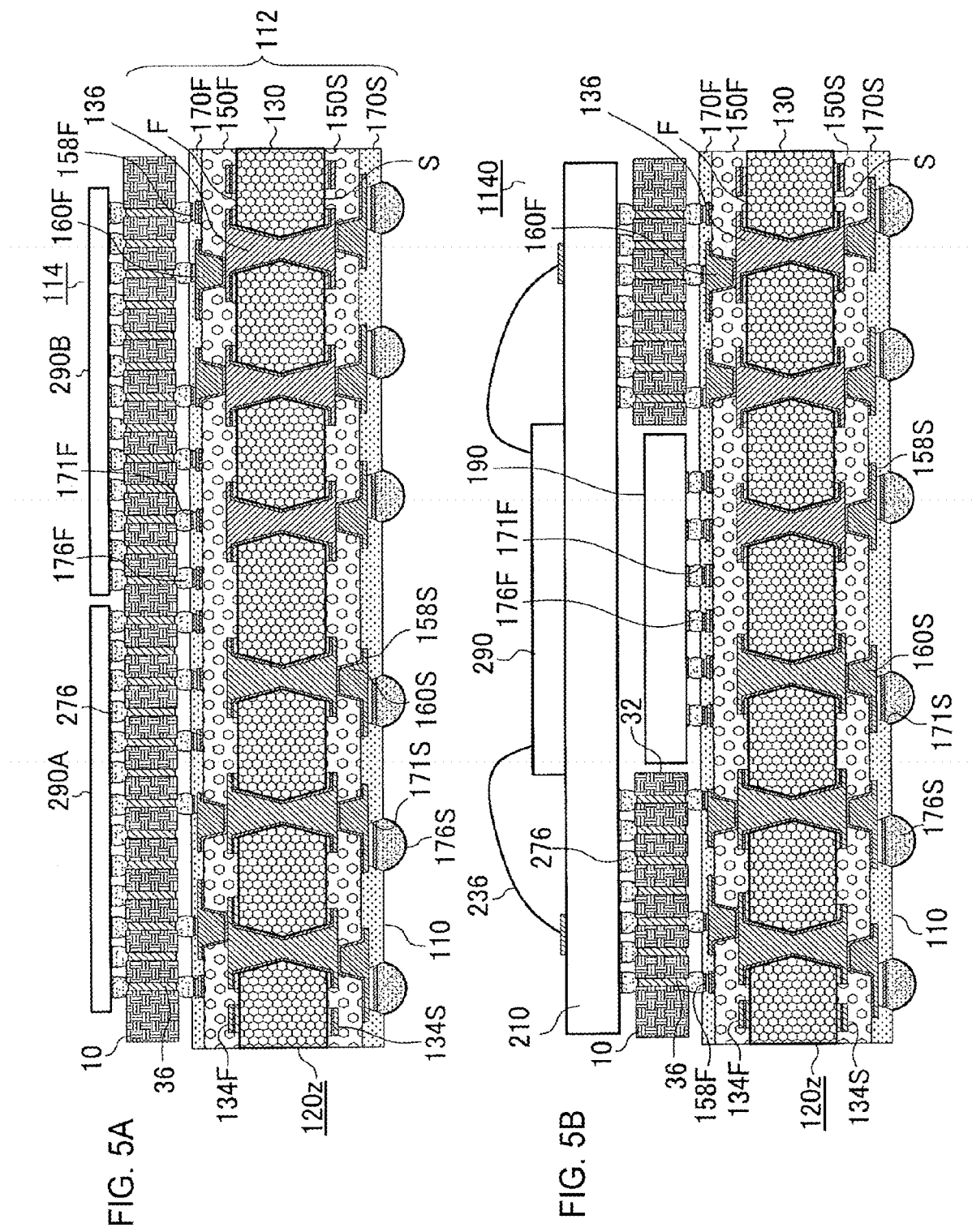

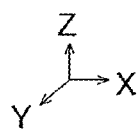
FIG. 7A
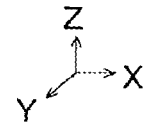
FIG. 7B
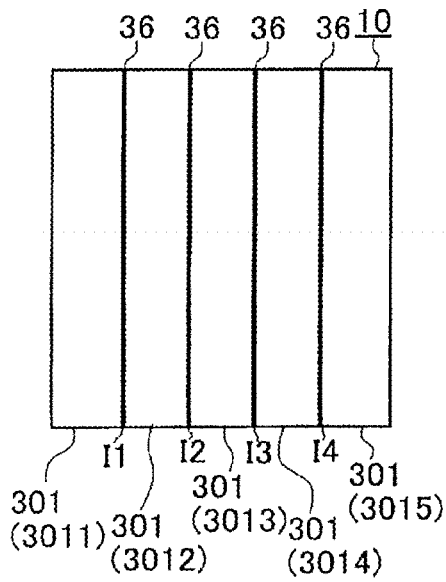
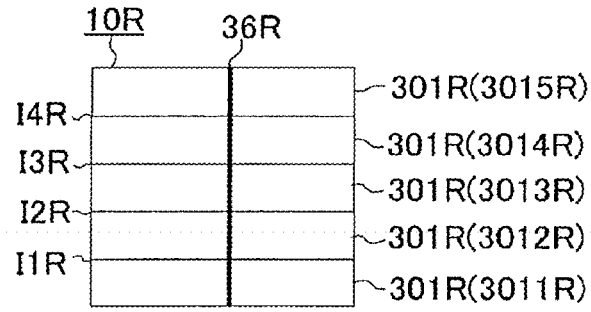
FIG. 7C
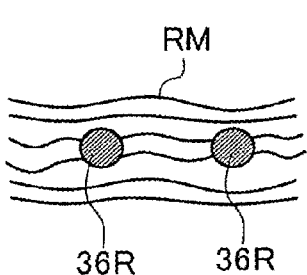
FIG. 7D
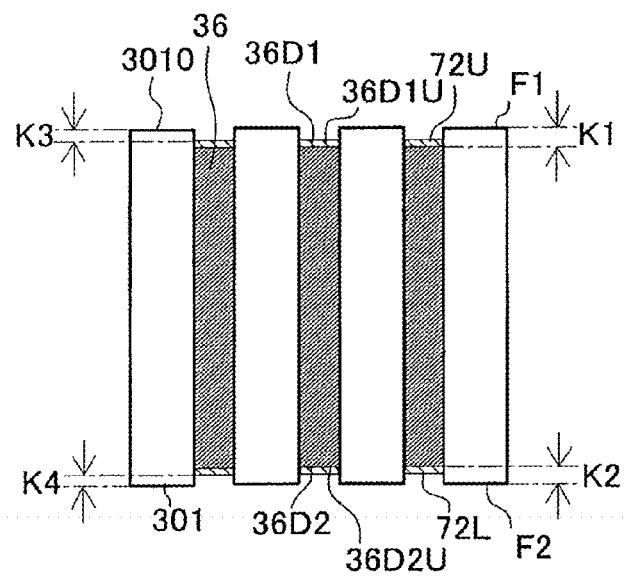

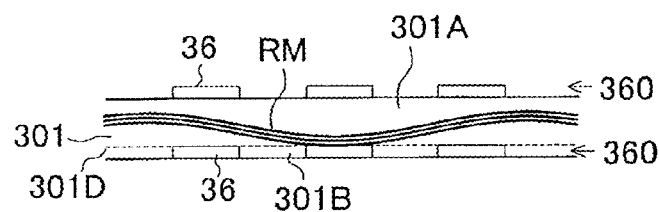
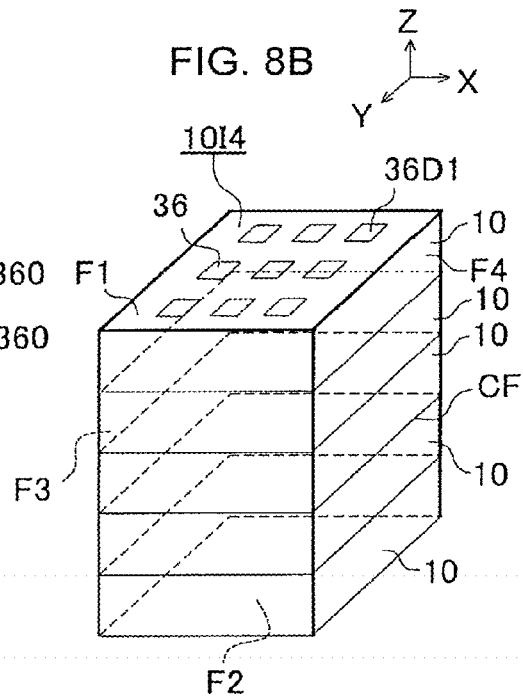
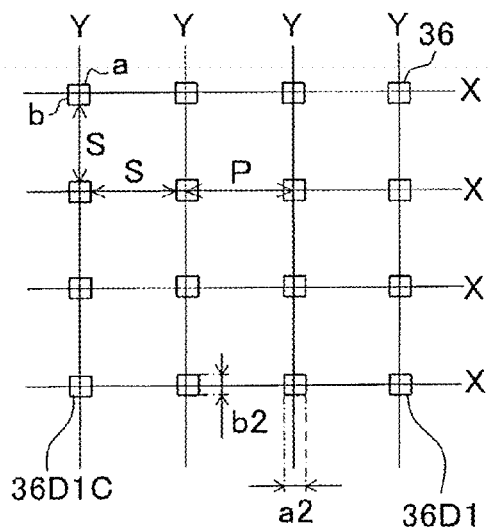
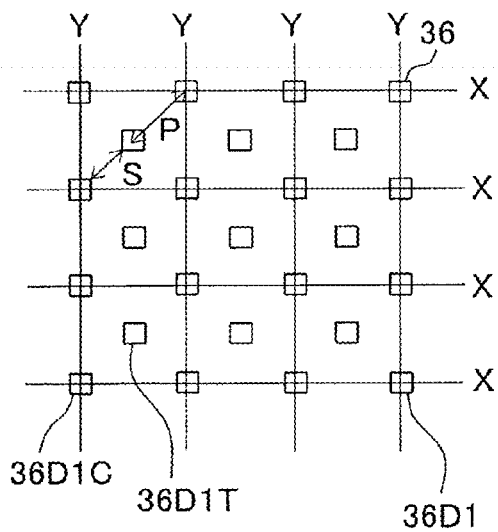

INTERPOSER AND CIRCUIT SUBSTRATE

CROSS-REFERENCE TO RELATED APPLICATIONS

The present application is based upon and claims the benefit of priority to Japanese Patent Applications No. 2015-142690, filed Jul. 17, 2015, and No. 2015-151873, filed Jul. 31, 2015. The entire contents of these applications are incorporated herein by reference.

BACKGROUND OF THE INVENTION

Field of the Invention

The present invention relates to an interposer and a circuit substrate.

Description of Background Art

Japanese Patent Laid-Open Publication No. 2004-356619 describes a relay substrate that has a thermal expansion coefficient of less than 5.0 ppm/° C. The entire contents of this publication are incorporated herein by reference.

SUMMARY OF THE INVENTION

According to one aspect of the present invention, an interposer includes an insulating plate including insulating layers and having a first surface, a second surface, a third surface and a fourth surface such that the second surface is on the opposite side of the first surface, the third surface is perpendicular to the first surface, the fourth surface is on the opposite side of the third surface, and the insulating layers are laminated on the third surface, and conductor layers formed in the insulating plate such that each of the conductor layers is interposed between adjacent insulating layers and includes straight conductors having first electrode portions exposed from the first surface at one ends and second electrode portions exposed from the second surface at opposite ends, respectively. The insulating layers include second insulating layers each sandwiched by adjacent conductor layers such that each of the second insulating layers integrally has an inter-conductor-layer insulating layer portion formed between the adjacent conductor layers and inter-conductor insulating layer portions formed between adjacent straight conductors in a respective one of the conductor layers.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a schematic diagram of an interposer of a first embodiment of the present invention;

FIG. 1B is a perspective view of a conductor;

FIG. 1C illustrates a configuration A;

FIG. 1D illustrates a configuration B;

FIG. 1E illustrates a configuration C;

FIG. 5A is a cross-sectional view of an application example of the interposer of the first embodiment;

FIG. 5B is a cross-sectional view of an application example of an interposer of a second embodiment;

FIGS. 7A and 7D illustrate an interposer of the embodiment;

FIGS. 7B and 7C illustrate an interposer of a reference example;

FIG. 8A is a cross-sectional view of an insulating layer that has a reinforcing material;

FIG. 8B illustrates a cutting plane (CF); and

FIGS. 8C and 8D illustrate examples of configuration s of conductors.

DETAILED DESCRIPTION OF THE EMBODIMENTS

Figure 2A:
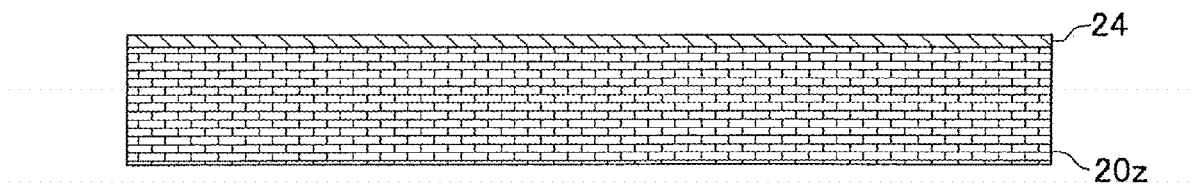
FIG. 2A-2D are manufacturing process diagrams of a printed wiring board of the first embodiment.

The embodiments will now be described with reference to the accompanying drawings, wherein like reference numerals designate corresponding or identical elements throughout the various drawings.

First Embodiment

FIG. 5A illustrates a cross section of an application example 114 of an interposer 10 of a first embodiment.

The application example 114 has a printed wiring board 110, the interposer 10 that is mounted on the printed wiring board 110, and electronic components (290A, 290B) that are mounted on the interposer 10. The interposer 10 and the printed wiring board 110 are connected via solder bumps (176F). A circuit substrate 112 is formed by the interposer 10 and the printed wiring board 110. In FIG. 5A, the multiple semiconductor elements (290A, 290B) are mounted on the interposer 10. The semiconductor elements (290A, 290B) and the interposer 10 are connected via solder bumps 276. An example of the semiconductor element (290A) is an IC chip. An example of the semiconductor element (290B) is a memory.

The printed wiring board 110 has a core substrate 130. The core substrate 130 has an insulating substrate (120z) that has a first surface (F) and a second surface (S) that is on an opposite side of the first surface (F), a first conductor layer (134F) that is formed on the first surface (F) of the insulating substrate, and a second conductor layer (134S) that is formed on the second surface of the insulating substrate. The core substrate further has a through-hole conductor 136 that connects the first conductor layer (134F) and the second conductor layer (134S).

An uppermost resin insulating layer (150F) is formed on the first surface (F) of the insulating substrate (120z) and on the first conductor layer (134F). An uppermost conductor layer (158F) is formed on the resin insulating layer (150F). The conductor layer (158F) and the first conductor layer (134F) or the through-hole conductor 136 are connected by an uppermost via conductor (160F) that penetrates the resin insulating layer (150F).

A lowermost resin insulating layer (150S) is formed on the second surface (S) of the insulating substrate (120z) and on the second conductor layer (134S) A lowermost conductor layer (158S) is formed on the resin insulating layer (150S). The conductor layer (158S) and the second conductor layer (134S) or the through-hole conductor 136 are connected by a lowermost via conductor (160S) that penetrates the resin insulating layer (150S).

A first solder resist layer (170F) having an opening (171F) is formed on the uppermost resin insulating layer (150F) and on the uppermost conductor layer (158F). The conductor layer (158F) that is exposed from the opening (171F) forms a pad, and a first solder bump (176F) is formed on the pad.

A second solder resist layer (170S) having an opening (171S) is formed on the lowermost resin insulating layer (150S) and on the lowermost conductor layer (158S). The conductor layer (158S) that is exposed from the opening (171S) forms a pad, and a second solder bump (176S) is formed on the pad.

FIG. 1A illustrates a schematic diagram of the interposer 10 of the first embodiment and X, Y and Z axes. The interposer 10 has substantially a shape of a regular hexahedron. As illustrated in FIG. 1A, the interposer 10 has a first surface (F1). A second printed wiring board 210 illustrated in FIG. 5B is mounted on the first surface (F1). Or, as illustrated in FIG. 5A, the semiconductor elements (290A, 290B) are directly mounted on the first surface (F1). The first surface (F1) of the interposer 10 and the second printed wiring board 210 oppose each other. The first surface (F1) of the interposer 10 and the semiconductor elements (290A, 290B) oppose each other. The first surface (F1) is substantially parallel to an X-Y plane. The first surface (F1) has a side (Lx) parallel to the X axis and a side (Ly) parallel to the Y axis. The side (Lx) has a length (x) of 500 µm or more and 2000 µm or less. The side (Ly) has a length (y) of 500 µm or more and 2000 µm or less.

As illustrated in FIG. 1A, the interposer 10 has a second surface (F2) that is on an opposite side of the first surface (F1). The second surface (F2) of the interposer 10 is mounted on the printed wiring board 110 illustrated in FIG. 5A or 5B. The second surface (F2) of the interposer 10 and the printed wiring board 110 oppose each other. The second surface (F2) is substantially parallel to the X-Y plane.

The interposer 10 has a third surface (F3) that is perpendicular to the first surface (F1) and has a fourth surface (F4) that is on an opposite side of the third surface (F3). The third surface (F3) is substantially parallel to a Y-Z plane. The fourth surface (F4) is substantially parallel to the Y-Z plane.

The interposer 10 has multiple insulating layers 301 laminated on the third surface (F3). An insulating plate 3010 is formed by the multiple insulating layers 301. A main surface of each of the insulating layers 301 is substantially parallel to the Y-Z plane. The third surface (F3) has a side (Lz) parallel to the Z axis. The side (Lz) has a length (z) of 50 µm or more and 200 µm or less. The length (z) of the side (Lz) is smaller than the length (x) of the side (Lx). A ratio of the side (Lx) to the side (Lz) (length (x)/length (z)) is 2.5 or more and 40 or less. The length (z) of the side (Lz) is smaller than the length (y) of the side (Ly). A ratio of the side (Ly) to the side (Lz) (length (y)/length (z)) is 2.5 or more and 40 or less.

As illustrated in FIG. 1A, the interposer 10 has multiple conductor layers 360. Each of the conductor layers 360 is formed by multiple conductors 36. The conductors 36 are formed substantially parallel to each other. Further, each of the conductor layers 360 is sandwiched by adjacent insulating layers 301. In FIG. 1A, the conductor layers 360 and the conductors 36 are simply illustrated. Only ends of the conductors that are exposed from the first surface (F) are depicted. A cross-sectional shape of each of the conductors 36 is substantially rectangular. The cross section of each of the conductors 36 is formed on the X-Y plane. One end of each of the conductors 36 is exposed from the first surface (F1) and the other end is exposed from the second surface (F2). The end of each of the conductors 36 that is exposed from the first surface (F1) is a first electrode (36D1), and the end of each of the conductors 36 that is exposed from the second surface (F2) is a second electrode (36D2). The second electrodes (36D2) are not illustrated in FIG. 1A. FIG. 1B illustrates one conductor 36 that has a first electrode (36D1) and a second electrode (36D2), and illustrates the X, Y and Z axes. The conductor 36 extends substantially straight from the first electrode (36D1) toward the second electrode (36D2). The conductor 36 is formed substantially perpendicular to the first surface (F1). The conductor 36 is formed substantially parallel to the Z axis. The conductor 36 is formed on the Y-Z plane.

FIG. 1C-1E illustrate examples of configuration of the insulating layers 301 and the conductor layers 360. In each of FIG. 1C-1E, adjacent conductor layers (360, 360) and one insulating layer 301 that is sandwiched by the adjacent conductor layers (360, 360) are illustrated. The insulating layers 301 illustrated in FIGS. 1C and 1D are second insulating layers. In each of FIG. 1C-1E, the insulating layer 301 has a lower surface (LF) and an upper surface (UF) that is on an opposite side of the lower surface (LF). Further, in each of FIG. 1C-1E, a conductor layer 360 depicted on a lower side is a lower side conductor layer (360L), and a conductor layer 360 depicted on an upper side is an upper side conductor layer (360U). The example illustrated in FIG. 1C is a configuration A; the example illustrated in FIG. 1D is a configuration B; and the example illustrated in FIG. 1E is a configuration C.

In the configuration A, the lower side conductor layer (360L) is embedded in the insulating layer 301, and the upper side conductor layer (360U) is formed on the insulating layer 301. The upper side conductor layer (360U) projects from the upper surface (UF) of the insulating layer 301.

In the configuration B, the lower side conductor layer (360L) is embedded in the insulating layer 301, and the upper side conductor layer (360U) is embedded in the insulating layer 301.

In the configuration C, the lower side conductor layer (360L) is formed on the insulating layer 301, and the upper side conductor layer (360U) is formed on the insulating layer 301. The upper side conductor layer (360U) projects from the upper surface (UF) of the insulating layer 301. The lower side conductor layer (360L) projects from the lower surface (LF) of the insulating layer 301.

The interposer 10 of the embodiment has one or more configuration selected from the configuration A, the configuration B and the configuration C. The interposer 10 may be formed to have only the configuration A. The interposer 10 may also have the configuration A and the configuration B. The interposer 10 may also have the configuration A, the configuration B and the configuration C.

As illustrated in FIG. 1C, the insulating layer (second insulating layer) 301 of the configuration A is formed by an inter-conductor-layer insulating layer (301A) that is formed between the adjacent conductor layers (360U, 360L) and an inter-conductor insulating layer (301B) that is formed between adjacent conductors 36 in the one conductor layer (360L). A dotted line is depicted in the insulating layer 301 in FIG. 1C. The dotted line indicates a boundary between the inter-conductor-layer insulating layer (301A) and the inter-conductor insulating layer (301B). However, since the inter-conductor-layer insulating layer (301A) and the inter-conductor insulating layer (301B) are integrally formed, the dotted line does not indicate an interface. In the configuration A, the insulating layer 301 is formed by one inter-conductor-layer insulating layer (301A) and one inter-conductor insulating layer (301B).

As illustrated in FIG. 1D, the insulating layer (second insulating layer) 301 of the configuration B is formed by an inter-conductor-layer insulating layer (301A) that is formed between the adjacent conductor layers (360U, 360L) and an inter-conductor insulating layer (301B) that is formed between adjacent conductors 36 in the conductor layers (360U, 360L). A dotted line is depicted in the insulating layer 301 in FIG. 1D. The dotted line indicates a boundary between the inter-conductor-layer insulating layer (301A) and the inter-conductor insulating layer (301B). However, since the inter-conductor-layer insulating layer (301A) and the inter-conductor insulating layer (301B) are integrally formed, the dotted line does not indicate an interface. In the configuration B, the insulating layer 301 is formed by one inter-conductor-layer insulating layer (301A) and two inter-conductor insulating layers (301B).

The inter-conductor-layer insulating layer (301A) and the inter-conductor insulating layers (301B) are simultaneously formed. The inter-conductor-layer insulating layer (301A) and the inter-conductor insulating layers (301B) are integrally formed. The inter-conductor-layer insulating layer (301A) and the inter-conductor insulating layers (301B) are formed from one resin film. The insulating layers 301 are each formed by a single insulating layer. All of the insulating layers 301 are each formed by a single insulating layer. Therefore, the insulating layers 301 of the configuration A and the configuration B are each formed by a single insulating layer. The second insulating layer is formed by the inter-conductor-layer insulating layer (301A) and the inter-conductor insulating layer (301B).

In the configuration C, the lower side conductor layer (360L) and the upper side conductor layer (360U) are not embedded in the insulating layer 301. Therefore, a thickness (D1) of the insulating layer 301 of the configuration C is likely to be uniform. It is preferable that, in the configuration C, the conductors 36 in the lower side conductor layer (360L) and the conductors 36 in the upper side conductor layer (360U) be conductors for transmitting a signal. For example, it is preferable that two conductors (36SU, 36SL) opposing each other across the insulating layer 301 be conductors for transmitting a signal. Control of characteristic impedance can be easily performed. When data passes through the conductors 36, the data is unlikely to deteriorate.

The thickness (D1) of the insulating layer 301 of the configuration C is likely to be uniform. Therefore, it is preferable that the conductors 36 in the upper side conductor layer (360U) in the configuration C are conductors for power supply, and the conductors 36 in the lower side conductor layer (360L) in the configuration C are conductors for grounding. In FIG. 1E, a conductor (36P) in the upper side conductor layer (360U) and a conductor (36E) in the lower side conductor layer (360L) oppose each other across the insulating layer 301. It is preferable that the conductor (36P) is a conductor for power supply and the conductor (36E) is a conductor for grounding. Since the thickness of the insulating layer 301 is uniform, even when the power source and the ground oppose each other, insulation reliability is unlikely to decrease.

Figure 6A:
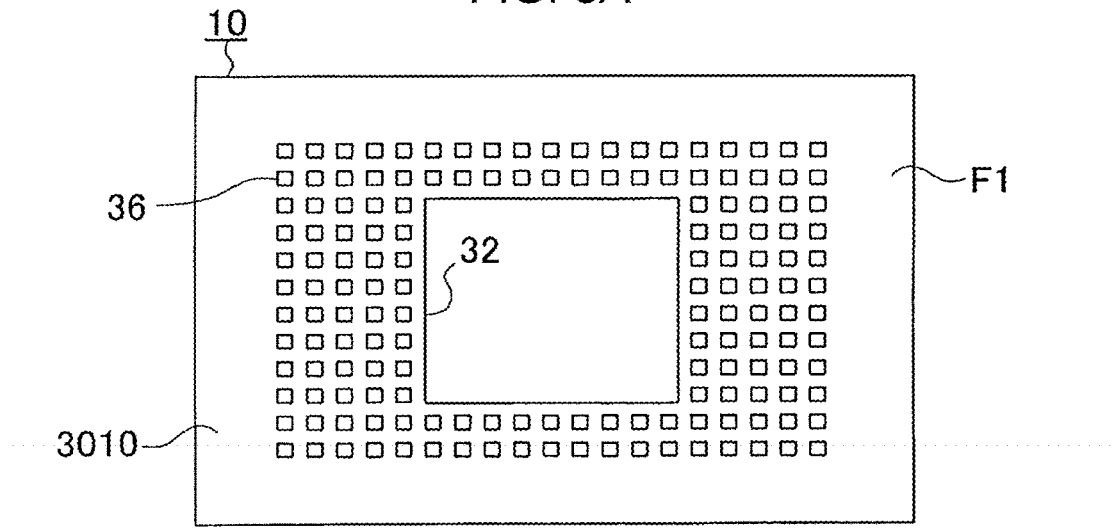
FIG. 6A is a plan view of the interposer of the second embodiment.
Figure 6B:
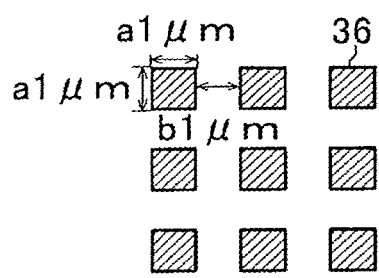
FIG. 6B illustrates cross sections and a configuration of conductors of the embodiment.
Figure 6C:
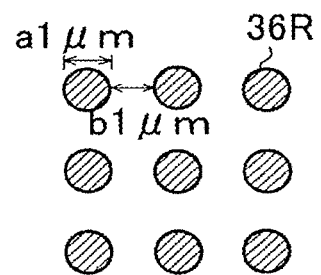
FIG. 6C illustrates cross sections and a configuration of conductors of a reference example.

FIG. 6B illustrates cross sections of the conductors 36 of the embodiment and a formation thereof. FIG. 6C illustrates cross sections of conductors (36R) of a reference example and a formation thereof. The cross section of each of the conductors 36 in FIG. 6B is a square, and a length of one side of the square is a1 µm. The cross section of each of the conductors (36R) in FIG. 6C is a circle, and a diameter of the circle is a1 µm. The length of one side of the cross section of each of the conductors 36 and the diameter of the cross section of each of the conductors (36R) are equal. The formation of the conductors 36 in FIG. 6B and the formation of the conductors (36R) in FIG. 6C are the same. A distance between adjacent conductors 36 and a distance between adjacent conductors (36R) are equal, and both of the distances are b1 µm. When the conductors 36 in FIG. 6B and the conductors (36R) in FIG. 6C are similarly formed, a cross-sectional area of the conductors 36 is larger than a cross-sectional area of the conductors (36R). When the cross sections of the conductors 36 are substantially rectangular, resistance of the conductors 36 is reduced. Since strength of the conductors 36 is increased, the conductors 36 are unlikely to deteriorate due to heat cycles. Reliability of connection via the conductors 36 is increased. A contact area between the conductors 36 and the insulating layer 301 is increased. The insulating layer 301 is unlikely to be peeled off from the conductors 36.

FIG. 7A illustrates a cross section of the interposer 10 of the embodiment. FIG. 7B illustrates a cross section of an interposer (10R) of the reference example. The X, Y and Z axes are illustrated in FIGS. 7A and 7B. The insulating layers 301 of the interposer 10 in FIG. 7A are formed parallel to the Y-Z plane, and insulating layers (301R) of the interposer (10R) in FIG. 7B are formed parallel to the X-Y plane. The number of the insulating layers 301 of the interposer 10 in FIG. 7A and the number of the insulating layers (301R) of the interposer (10R) in FIG. 7B are the same. Both of the numbers of the insulating layers are 5. In the interposer 10 in FIG. 7A, the insulating layers 301 are, from left, an insulating layer 3011, an insulating layer 3012, an insulating layer 3013, an insulating layer 3014, and an insulating layer 3015. In the interposer (10R) in FIG. 7B, the insulating layers (301R) are, from a lower side, an insulating layer (3011R), an insulating layer (3012R), an insulating layer (3013R), an insulating layer (3014R), and an insulating layer (3015R).

Further, the interposer 10 in FIG. 7A has the conductors 36 that are parallel to the Z axis, and the conductors 36 are each formed between adjacent insulating layers 301. The interposer (10R) in the FIG. 7B has the conductors (36R) that are parallel to Z axis, and the conductors (36R) penetrate all of the insulating layers (301R). The conductors (36, 36R) are depicted by lines. It is difficult for the insulating layers 301 of the interposer 10 in FIG. 7A to have the same physical properties. Therefore, when the interposer 10 is subjected to heat cycles, stresses are likely to accumulate in interfaces (I1, I2, I3, I4) between adjacent insulating layers 301.

In FIG. 7A, the conductors 36 are sandwiched by adjacent insulating layers 301. Therefore, for example, a conductor 36 that is sandwiched by the insulating layer 3011 and the insulating layer 3012 receives a stress from the interface (I1). In the example of FIG. 7A, a conductor 36 receives a stress from one interface, and the stress acts on four side surfaces of the conductor 36.

It is difficult for the insulating layers (301R) of the interposer (10R) in FIG. 7B to have the same physical properties. Therefore, when the interposer (10R) is subjected to heat cycles, stresses are likely to accumulate in interfaces (I1R, I2R, I3R, I4R) between adjacent insulating layers. In FIG. 7B, the conductors (36R) penetrate all of the insulating layers (301R). Therefore, the conductors (36R) receive stresses from all of the interfaces (I1R, I2R, I3R, I4R). In the example of FIG. 7B, a conductor (36R) receives stresses from the four interfaces, and the stresses act on cross sections of the conductor (36R).

When the example of FIG. 7A and the example of FIG. 7B are compared to each other, a conductor (36R) in FIG. 7B receives stresses from four interfaces, whereas a conductor 36 in FIG. 7A receives a stress from one interface. In this way, it is likely that a conductor (36R) in the example of FIG. 7B receives more stresses than a conductor 36 in the example of FIG. 7A. In the example of FIG. 7B, stresses act on cross sections of a conductor (36R), whereas in the example of FIG. 7A, a stress acts on side surfaces of a conductor 36. When areas that receive stresses are compared to each other, the area in the example of FIG. 7A is likely to be larger than the area in the example of FIG. 7B. Therefore, when the conductors 36 in FIG. 7A and the conductors (36R) in FIG. 7B are subjected to the same heat cycles, the reliability of the connection via the conductors (36R) in FIG. 7B is likely to be lower than the reliability of the connection via the conductors 36 in FIG. 7A.

In the present embodiment, the multiple insulating layers 301 are laminated on the third surface (F3). Therefore, an interface between adjacent insulating layers (301, 301) is positioned in the Y-Z plane. Therefore, the interposer 10 may be weak against a force parallel to the X axis. As illustrated in FIG. 5A, the interposer 10 is sandwiched by the printed wiring board 110 and the semiconductor elements (290A, 290B). It is difficult for a thermal expansion coefficient of the interposer 10 and a thermal expansion coefficient of the printed wiring board 110 to be the same. It is difficult for the thermal expansion coefficient of the interposer 10 and a thermal expansion coefficient of the semiconductor elements (290A, 290B) to be the same. Therefore, it is likely that the interposer receives a force parallel to the X axis. A problem due to the force parallel to the X axis may occur in the interposer 10. A crack may occur in the insulating layers. Due to the crack, a conductor 36 may be disconnected. In order to reduce such a risk, in the embodiment, the insulating layers 301 in the configuration A and the configuration B are each formed by the inter-conductor-layer insulating layer (301A) and the inter-conductor insulating layer (301B), and the inter-conductor-layer insulating layer (301A) and the inter-conductor insulating layer (301B) are formed from one resin layer. Therefore, an interface does not exist between the inter-conductor-layer insulating layer (301A) and the inter-conductor insulating layer (301B). An interface parallel to the Y-Z plane is reduced. Therefore, even when the interposer receives a force parallel to the X axis, a problem is unlikely to occur. In order to prevent occurrence of a problem, the inter-conductor-layer insulating layer (301A) is formed of a reinforcing material, inorganic particles and resin. The inter-conductor insulating layer (301B) is formed of inorganic particles and resin. The insulating layers are reinforced by the reinforcing material. The interposer 10 is reinforced by the reinforcing material. The conductors 36 can be formed thin. For example, lengths (a2, b2) of sides (a, b) of a cross section of a conductor 36 is 10 μm or more and 30 μm or less. Examples of the reinforcing material include a glass cloth, inorganic fibers and resin fibers. The reinforcing material is formed parallel to the third surface (the Y-Z plane). The reinforcing material is formed parallel to the main surface of the insulating layers 301. The conductors 36 do not penetrate the reinforcing material. Since a through hole is not formed in the reinforcing material, the strength of the reinforcing material does not decrease. Further, as illustrated in FIG. 7C, when adjacent conductors (36R, 36R) penetrate the same reinforcing material (RM), migration is likely occur along the reinforcing material (RM) between the adjacent conductors (36R, 36R). However, in the embodiment, since the conductors 36 do not penetrate the reinforcing material, a short circuit between the conductors 36 due to the reinforcing material can be prevented. A pitch (P) between adjacent conductors 36 can be reduced. A distance between centers of adjacent conductors 36 is the pitch (P). Or, a distance between centers of gravity of adjacent conductors 36 is the pitch (P). An example of the pitch (P) is 30 μm or more and 50 μm or less. Examples of the inorganic particles include silica particles and alumina particles. Examples of the resin include epoxy and polyimide. The inorganic particles of the inter-conductor-layer insulating layer (301A) and the inorganic particles of the inter-conductor insulating layer (301B) are the same. The resin of the inter-conductor-layer insulating layer (301A) and the resin of the inter-conductor insulating layer (301B) are the same. When the inter-conductor insulating layer (301B) does not have a reinforcing material, a short circuit due to migration is prevented.

FIGS. 8C and 8D illustrate examples of formations and shapes of the conductors 36. The formations and shapes of the conductors 36 are described using formations and shapes of the first electrodes (36D1). Straight lines (X) parallel to the X axis and straight lines (Y) parallel to the Y axis are depicted in FIGS. 8C and 8D. The straight lines (X) and the straight lines (Y) intersect at a substantially right angle. In the example of FIG. 8C, first electrodes (first electrodes at the intersection points) (36D1C) are arrayed at the intersection points of the straight lines (X) and the straight lines (Y). In the example of FIG. 8C, the first electrodes (36D1) are formed by the first electrodes (36D1C) at the intersection points. In the example of FIG. 8D, the first electrode (36D1) are formed by the first electrodes (36D1C) at the intersection points and first electrodes (36D1T) at centers. The first electrodes (36D1T) at centers are positioned at substantially centers of smallest substantially rectangular areas partitioned by the straight lines (X) and the straight lines (Y). Formation of the second electrode (36D2) is the same as the formation of the first electrodes (36D1).

The first electrodes (36D1) in FIG. 8C or FIG. 8D have a substantially rectangular shape. The first electrodes (36D1) each have the side (a) and the side (b). The conductors 36 of the embodiment do not penetrate the multiple insulating layers 301. Further, the insulating layers 301 are each formed by a single insulating layer. Therefore, the conductors 36 can be formed thin. When the conductors 36 are thin, a size of the interposer 10 in the X-Y directions is reduced. A stress that acts on a cross section of a conductor post 36 is reduced. Therefore, even when the length (a2) of the side (a) and the length (b2) of the side (b) are 5 μm or more and 80 μm or less, a crack is unlikely to enter the conductors 36. The reliability of the connection via the conductors 36 is unlikely to decrease due to heat cycles. When the conductors 36 are thick, the size of the interposer in the X-Y directions becomes large. A stress that acts on a cross section of a conductor post 36 is increased. When the length (a2) of the side (a) and the length (b2) of the side (b) exceed 80 μm, the reliability of the connection via the conductors 36 is likely to decrease. When the length (a2) of the side (a) and the length (b2) of the side (b) are less than 5 μm, since the conductors 36 are thin, the reliability of the connection via the conductors 36 is likely to decrease.

The pitch (P) and a space (S) are illustrated in FIGS. 8C and 8D. The space (S) is a distance between adjacent conductors 36. The pitch (P) and the space (S) are 5 μm or more and 80 μm or less. A high-density interposer 10 can be provided. When the space (S) is 15 μm or more and 25 μm or less and the pitch (P) is 30 μm or more and 50 μm or less, the distance between adjacent conductors 36 is appropriate. A data transmission distance via the conductors 36 is shortened. When data is transmitted through the conductors 36, the data is unlikely to deteriorate.

When the length (a2) of the side (a) and the length (b2) of the side (b) are 15 μm or more and 25 μm or less and the pitch (P) is 35 μm or more and 45 μm or less, the thickness of the conductors 36 and the pitch (P) are appropriate. Therefore, the size of the interposer 10 in the X-Y directions is appropriate. The interposer 10 having an appropriate size is reinforced by the conductors 36. Warpage of the interposer 10 due to heat cycles is reduced. Even when an IC chip mounted on the printed wiring board 110 and a memory mounted on the second printed wiring board 210 are connected via the conductors 36 of the interposer 10, the memory is unlikely to malfunction due to heat generated by the IC chip.

FIG. 7D is a cross-sectional view illustrating a portion of the interposer 10 of the embodiment. The interposer in FIG. 7D has the first surface (F1), the second surface (F2), the conductors 36, the first electrodes (36D1), upper surfaces (36D1U) of the first electrodes (36D1), the second electrodes (36D2), upper surfaces (36D2U) of the second electrodes (36D2), the insulating layers 301, and the insulating plate 3010. The upper surfaces (36D1U) are surfaces exposed from the first surface (F1), and the upper surfaces (36D2U) are surfaces exposed from the second surface (F2). The upper surfaces (36D1U) and the first surface (F1) may be formed on a common plane. However, in FIG. 7D, the upper surfaces (36D1U) and the first surface (F1) are not positioned on the same plane.

The upper surfaces (36D1U) are recessed from the first surface (F1). A distance (K1) between the upper surfaces (36D1U) and the first surface (F1) is 1 μm or more and 10 μm or less. The upper surfaces (36D2U) and the second surface (F2) may be formed on a common plane. However, in FIG. 7D, the upper surfaces (36D2U) and the second surface (F2) are not positioned on the same plane. The upper surfaces (36D2U) are recessed from the second surface (F2). A distance (K2) between the upper surfaces (36D2U) and the second surface (F2) is 1 μm or more and 10 μm or less. Since the interposer 10 has the distances (K1, K2), the conductors 36 are not directly subjected to an impact. Even when the conductors 36 are thin, the conductors 36 can be stable for a long period of time. Insulation reliability between adjacent first electrodes (36D1) is high. Insulation reliability between adjacent second electrodes (36D2) is high. Even when bumps are formed on the first electrodes (36D 1) and the second electrodes (36D2), insulation reliability between adjacent bumps is high.

A protective film (72U) for preventing oxidation of a first electrode (36D1) can be formed on the upper surface (36D1U) of the first electrode (36D1). The protective film (72U) has a surface (upper surface) that is exposed from the first surface (F1). The upper surface of the protective film (72U) is recessed from the first surface (F1). A distance (K3) between the upper surface of the protective film (72U) and the first surface (F1) is 1 μm or more and 10 μm or less. A protective film (72L) for preventing oxidation of a second electrode (36D2) can be formed on the upper surface (36D2U) of the second electrode (36D2). The protective film (72L) has a surface (upper surface) that is exposed from the second surface (F2). The upper surface of the protective film (72L) is recessed from the second surface (F2). A distance (K4) between the upper surface of the protective film (72L) and the second surface (F2) is 1 μm or more and 10 μm or less. When the distances (K3, K4) exist, the conductors 36 are not directly subjected to an impact. Even when the conductors 36 are thin, the conductors 36 can be stable for a long period of time. Insulation reliability between adjacent first electrodes (36D1) is high. Insulation reliability between adjacent second electrodes (36D2) is high. Even when bumps are formed on the first electrodes (36D 1) and the second electrodes (36D2), insulation reliability between adjacent bumps is high.

Examples of the protective films (72U, 72L) include Ni/Au and OSP (Organic Solderability Preservative) films.

Method for Manufacturing Interposer of First Embodiment

A method for manufacturing the interposer 10 of the first embodiment is illustrated in FIG. 2A-4C.

A first support plate (20z) and a metal foil 24 are prepared (FIG. 2A). In FIG. 2A, the metal foil 24 is laminated on the first support plate (20z). Examples of the first support plate (20z) include a metal plate and a double-sided copper-clad laminated plate. Examples of the metal foil 24 include a copper foil and a nickel foil.

Figure 2B:
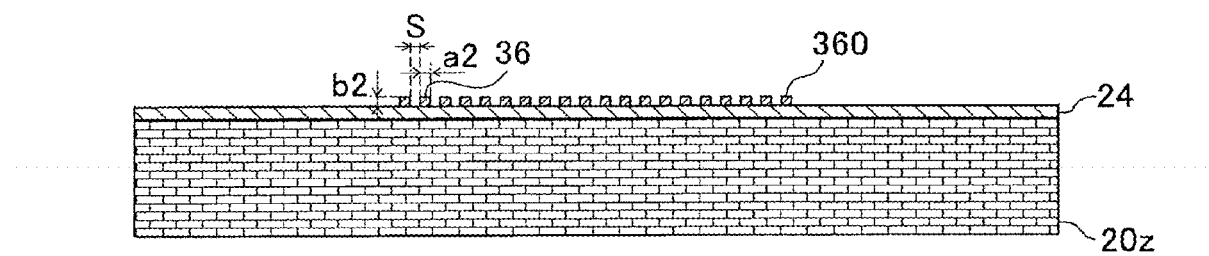

A plating resist for forming conductors 36 is formed on the copper foil 24. An electrolytic copper plating film is formed by electrolytic plating on the copper foil 24 that is exposed from the plating resist. The plating resist is removed. A conductor layer (first conductor layer) 360 is formed that has conductors 36 that are formed from the electrolytic plating film (FIG. 2B). The first conductor layer 360 has multiple conductors 36, and the conductors 36 are arrayed substantially parallel to each other. The conductors 36 contained in the first conductor layer 360 are formed by the electrolytic plating film only.

The length (a2) of the side (a) and the length (b2) of the side (b) of each of the conductors 36 in FIG. 2B are 20 μm, and the space (S) is 20 μm.

Figure 2C:
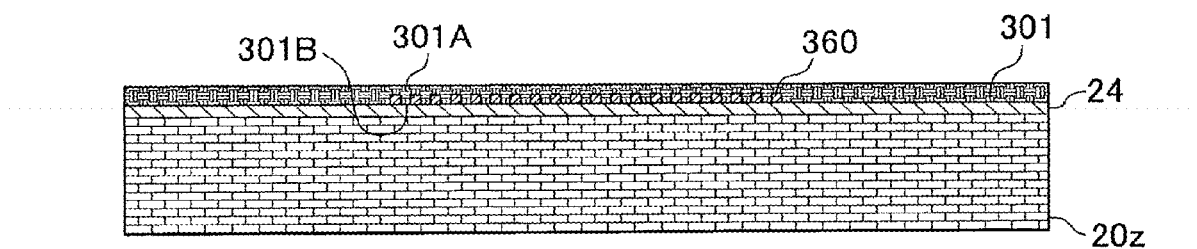

An insulating layer 301 is formed on the first conductor layer 360 and on the copper foil 24 (FIG. 2C). The insulating layer 301 has a thickness (D1) of 20 μm.

The insulating layer 301 is formed of a resin film that is formed of resin, a reinforcing material and particles. The resin film is laminated on the first conductor layer 360 and on the copper foil 24, and hot pressing is performed. The resin and the inorganic particles in the resin film are filled between the conductors 36. The resin between the conductors 36 is cured. An inter-conductor insulating layer (301B) is formed from the resin and the inorganic particles. An inter-conductor-layer insulating layer (301A) is formed on the first conductor layer 360 and on the inter-conductor insulating layer (301B) from the resin, the reinforcing material and the inorganic particles from the resin film.

Figure 2D:
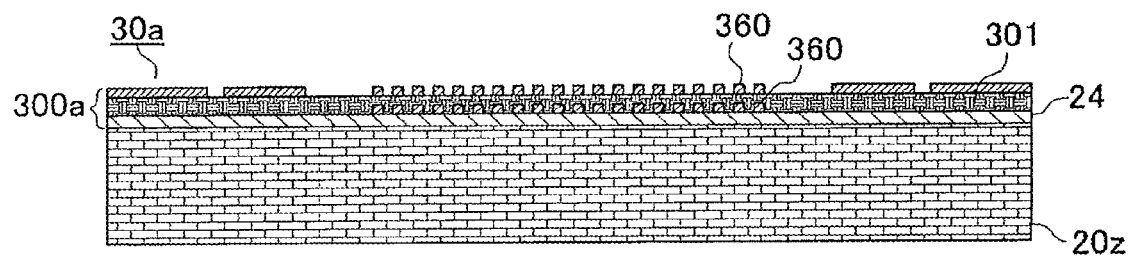

The insulating layer 301 has the reinforcing material. A seed layer is formed on the insulating layer 301. A plating resist for forming conductors 36 is formed on the seed layer. An electrolytic plating film is formed on the seed layer that is exposed from the plating resist. The plating resist is removed. The seed layer that is exposed from the electrolytic plating film is removed. The seed layer is formed by electroless plating or by sputtering. A conductor layer (second conductor layer) 360 is formed from the seed layer and the electrolytic plating film on the seed layer (FIG. 2D). The second conductor layer 360 is formed on the insulating layer 301. The second conductor layer 360 has multiple conductors 36, and the conductors 36 are arrayed substantially parallel to each other. The conductors 36 contained in the second conductor layer 360 are formed by the electrolytic plating film and the seed layer. As a result, a first intermediate (30*a*) is formed from the first conductor layer 360 on the copper foil 24, the insulating layer 301 on the first conductor layer 360, and the second conductor layer 360 on the insulating layer 301. A first halfway substrate (300*a*) is formed by the first intermediate (30*a*) and the copper foil 24. The insulating layer 301 is sandwiched by the first conductor layer 360 and the second conductor layer 360. Examples of the seed layer include an electroless copper plating film and a sputtering film formed of copper. Examples of the electrolytic plating film include an electrolytic copper plating film and an electrolytic silver plating film.

Figure 3A:
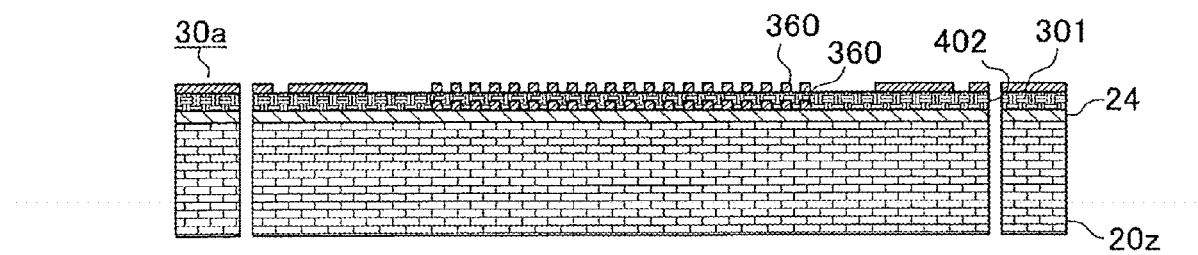
FIG. 3A-3D are manufacturing process diagrams of the printed wiring board of the first embodiment.
Figure 3B:
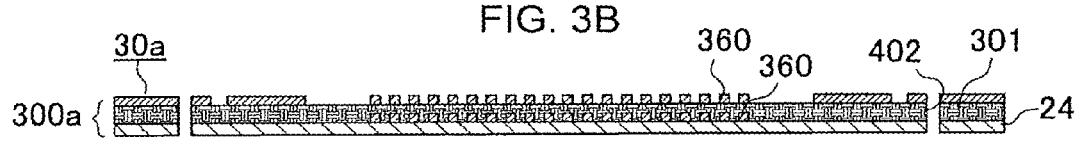
Figure 3C:
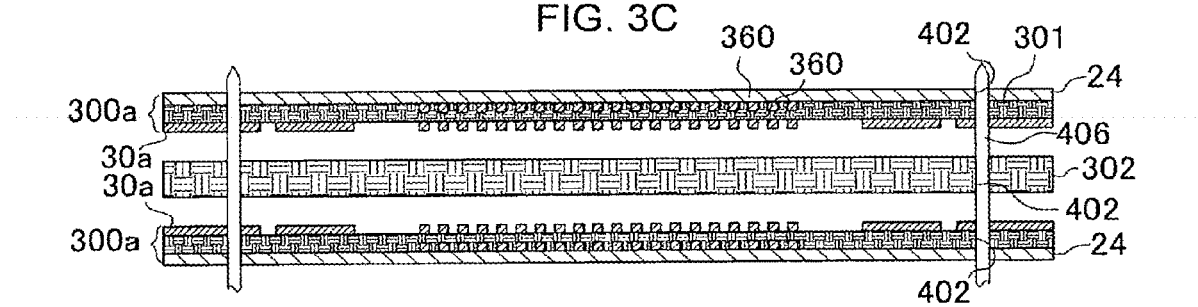
Figure 3D:
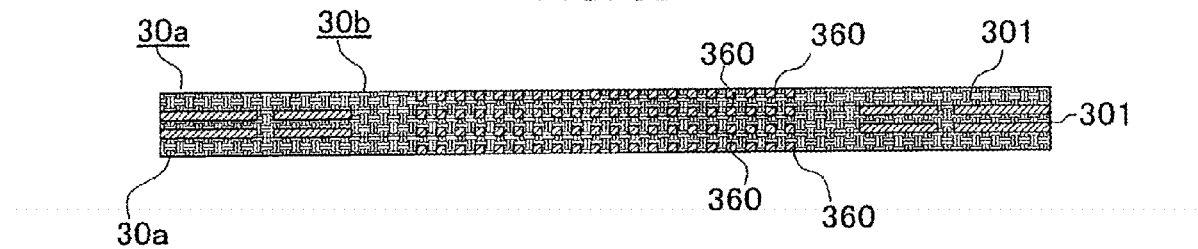

A positioning through hole 402 is formed that penetrates the first support plate (20*z*), the copper foil 24, and the first intermediate (30*a*) (FIG. 3A). By separating the first support plate (20*z*) and the copper foil 24, the first intermediate (30*a*) is separated from the first support plate (20*z*). The first halfway substrate (300*a*) is separated from the first support plate (20*z*) (FIG. 3B). Two first halfway substrates (300*a*) and a resin film 302 for forming an insulating layer 301 are prepared. The resin film 302 has a positioning through hole 402. The resin film 302 and the two first halfway substrates (300*a*) are laminated such that the resin film 302 containing resin, a reinforcing material and inorganic particles is sandwiched by the two first halfway substrates (300*a*). By inserting a pin 406 into the through hole 402, positions of the conductors 36 in the two first halfway substrates (300*a*) are aligned. By curing the resin film 302, an insulating layer 301 including an inter-conductor-layer insulating layer (301A) and an inter-conductor insulating layer (301B) is formed from the resin film 302. The inter-conductor-layer insulating layer (301A) has the reinforcing material. The two first halfway substrates (300*a*) are bonded by the insulating layer 301. The copper foil 24 that is laminated on the first intermediate (30*a*) (the copper foil that forms the first halfway substrate (300*a*)) is removed. A second intermediate (30*b*) is formed from two first intermediates (30*a*, 30*a*) and the insulating layer 301 sandwiched by the two first intermediates (30*a*, 30*a*) (FIG. 3D). The second intermediate (30*b*) is formed by one configuration B illustrated in FIG. 1D and two configuration s A illustrated in FIG. 1C. The configuration B is sandwiched by the two configuration s A. The configuration A is laminated on the configuration B via the insulating layer 301 such that the upper side conductor layer (360U) of the configuration A in FIG. 1C and the upper side conductor layer (360U) of the configuration B in FIG. 1D oppose each other. Further, the configuration A is laminated on the configuration B via the insulating layer 301 such that the lower side conductor layer (360L) of the configuration B in FIG. 1D and the upper side conductor layer (360U) of the configuration A in FIG. 1C oppose each other.

Figure 4A:
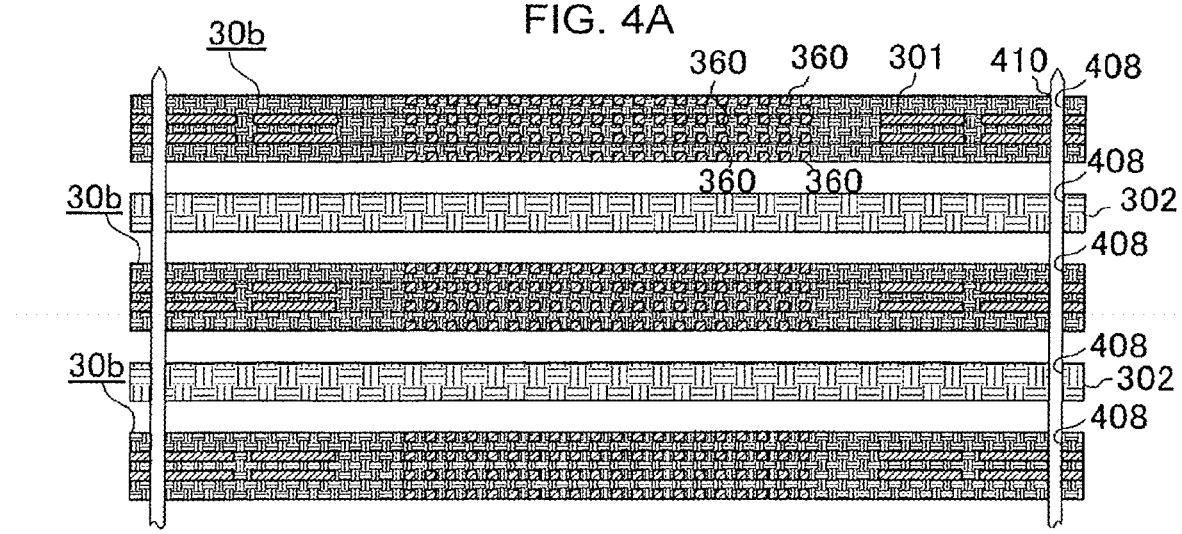
FIG. 4A-4C are manufacturing process diagrams of the printed wiring board of the first embodiment.
Figure 4B:
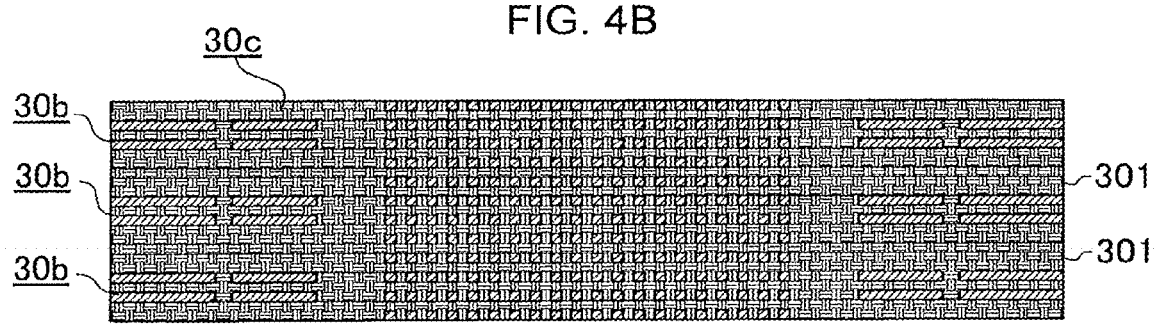

Three second intermediates (30*b*) and two resin films 302 for forming insulating layers 301 are prepared. A positioning through hole 408 is formed in the second intermediates (30*b*) and the resin films 302 (FIG. 4A). The second intermediates (30*b*) and the resin films 302 are laminated such that one resin film 302 is sandwiched by two second intermediates (30*b*). By inserting a pin 410 into the through hole 408, positions of the conductors 36 in the second intermediates (30*b*) are aligned (FIG. 4A). By curing the resin films 302, insulating layers 301 that each have a reinforcing material are formed from the resin films 302. Adjacent second intermediates (30*b*) are bonded by an insulating layer 301. A third intermediate (30*c*) is formed from the three second intermediates (30*b*, 30*b*, 30*b*) and the insulating layers (301, 301) that are sandwiched by the second intermediates (FIG. 4B).

Figure 4C:
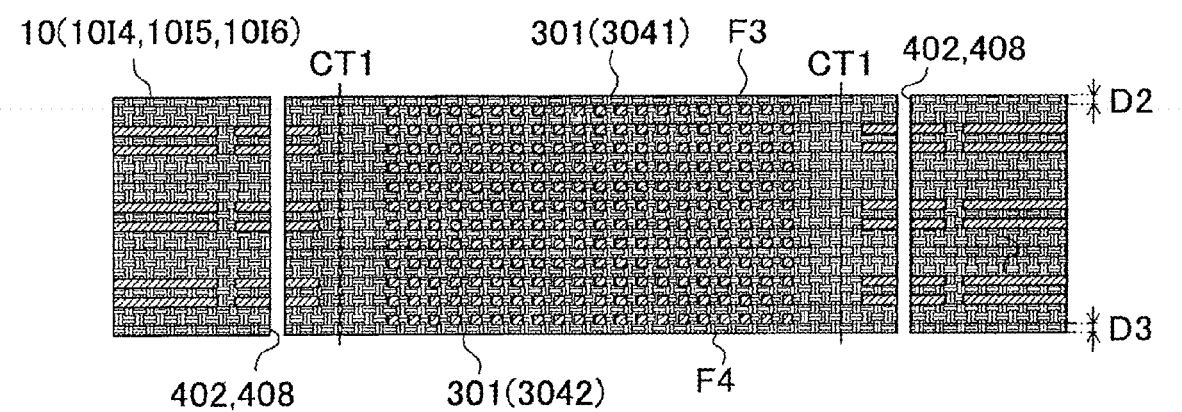

Insulating layers (301, 301) are respectively formed on both sides of the third intermediate (30*c*). The insulating layers (301, 301) that are laminated on the both sides of the third intermediate (30*c*) are respectively a first outermost insulating layer 3041 and a second outermost insulating layer 3042. The first outermost insulating layer 3041 has a third surface (F3), and the third surface (F3) is exposed to the outside. The second outermost insulating layer 3042 has a fourth surface (F4), and the fourth surface (F4) is exposed to the outside. A thickness (D2) of the first outermost insulating layer 3041 and a thickness (D3) of the second outermost insulating layer 3042 may be thicker than the thickness of the other insulating layers (inner side insulating layers). Strength of the interposer 10 is increased. The conductors 36 are unlikely to deteriorate due to heat cycles. The thickness (D1) of the insulating layers (inner side insulating layers) 301 other than the outermost insulating layers (3041, 3042) is a distance between adjacent conductor layers. The thickness (D2) of the first outermost insulating layer 3041 is a distance between the third surface (F3) and a conductor layer 360 that is formed on the first outermost insulating layer 3041. The thickness (D3) of the second outermost insulating layer 3042 is a distance between the fourth surface (F4) and a conductor layer 360 that is formed on the second outermost insulating layer 3042. The thickness (D1) is illustrated in FIG. 1C-1E. The thicknesses (D2, D3) are illustrated in FIG. 4C. A ratio (thickness (D2)/thickness (D1)) of the thickness (D2) to the thickness (D1) is 1.2 or more and 2 or less. A ratio (thickness (D3)/thickness (D1)) of the thickness (D3) to the thickness (D1) is 1.2 or more and 2 or less. The size and strength of the interposer 10 are appropriate. The conductors 36 are unlikely to deteriorate due to heat cycles. The inner side insulating layers are the insulating layers 301 that are formed between the first outermost insulating layer 3041 and the second outermost insulating layer 3042.

By respectively laminating the outermost insulating layers (3041, 3042) on the both sides of the third intermediate (30*c*), the interposer 10 is completed (FIG. 4C). Or, a fourth intermediate (10I4) having multiple interposers 10 is completed. Or, a fifth intermediate (10I5) having a non-product region and the interposer 10 is completed. Or, a sixth intermediate (10I6) having a non-product region and multiple interposers 10 is completed.

Figure 6D:
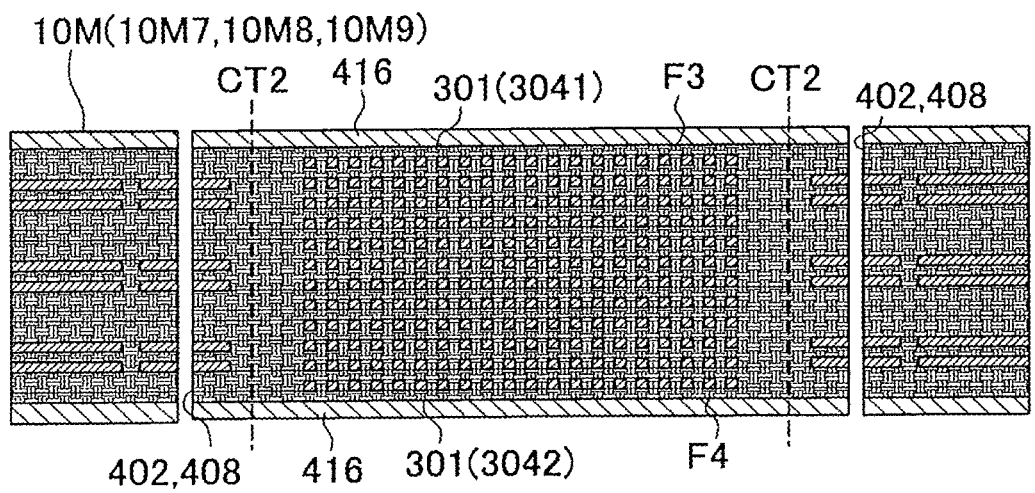
FIG. 6D illustrates an interposer with a metal foil.

As illustrated in FIG. 6D, a metal foil 416 can be laminated on the third surface (F3) of the first outermost insulating layer 3041. A metal foil 416 can be laminated on the fourth surface (F4) of the second outermost insulating layer 3042. An interposer (10M) with a metal foil is completed. Or, a seventh intermediate (10M7) having multiple interposers (10M) with a metal foil is completed. Or, an eighth intermediate (10M8) having a non-product region and an interposer (10M) with a metal foil is completed. Or, a ninth intermediate (10M9) having a non-product region and multiple interposers (10M) with a metal foil is completed. Examples of the metal foil 416 include a copper foil and a nickel foil. According to interposer (10M) with a metal foil, due to the metal foils 416, the conductors 36 in the interposer 10 are shielded. When data is transmitted through the conductors 36, the data is unlikely to deteriorate.

In order to manufacture individual interposers 10 from the fourth intermediate, the fourth intermediate (10I4) is cut. A plane along which the fourth intermediate (10I4) is cut is substantially perpendicular to the conductors 36. The plane along which the fourth intermediate (10I4) is cut is substantially parallel to the X-Y plane. The first surface (F1) and the second surface (F2) of the interposer 10 are cutting planes. A cutting plane (CF) is illustrated in FIG. 8B. In FIG. 8B, the fourth intermediate 10I4 is divided into five interposers 10.

In order to manufacture individual interposers (10M) with a metal foil from the seventh intermediate (10M7), the seventh intermediate (10M7) is cut. A plane along which the seventh intermediate (10M7) is cut is substantially perpendicular to the conductors 36. The plane along which the seventh intermediate (10M7) is cut is substantially parallel to the X-Y plane. A first surface (F1) and a second surface (F2) of an interposer (10M) with a metal foil are cutting planes.

In order to manufacture the interposer 10 from the fifth intermediate (10I5), the non-product region is cut and removed. A plane along which the fifth intermediate (10I5) is cut is substantially parallel to the conductors 36. The plane along which the fifth intermediate (10I5) is cut is substantially parallel to the Y-Z plane. The fifth intermediate 10I5 is cut along a straight line (CT1) in FIG. 4C. The positioning through holes (402, 408) are formed in the non-product region.

In order to manufacture the interposer (10M) with a metal foil from the eighth intermediate (10M8), the non-product region is cut and removed. A plane along which the eighth intermediate (10M8) is cut is substantially parallel to the conductors 36. The plane along which the eighth intermediate (10M8) is cut is substantially parallel to the Y-Z plane. The eighth intermediate (10M8) is cut along a straight line (CT2) in FIG. 6D. The positioning through holes (402, 408) are formed in the non-product region.

In order to manufacture individual interposers 10 from the sixth intermediate (10I6), the sixth intermediate (10I6) is cut and divided. Further, the non-product region is cut and removed. A plane along which the sixth intermediate (10I6) is divided is substantially perpendicular to the conductors 36. The plane along which the sixth intermediate (10I6) is divided is substantially parallel to the X-Y plane. A plane along which the sixth intermediate (10I6) is cut in order to remove the non-product region is substantially parallel to the conductors 36. The cutting plane for removing the non-product region is substantially parallel to the Y-Z plane. The first surface (F1) and the second surface (F2) of the interposer 10 are cutting planes.

In order to manufacture individual interposers 10 with a metal foil from the ninth intermediate (10M9), the ninth intermediate (10M9) is cut and divided. Further, the non-product region is cut and removed. A plane along which the ninth intermediate (10M9) is divided is substantially perpendicular to the conductors 36. The plane along which the ninth intermediate (10M9) is divided is substantially parallel to the X-Y plane. A plane along which the ninth intermediate (10M9) is cut in order to remove the non-product region is substantially parallel to the conductors 36. The cutting plane for removing the non-product region is substantially parallel to the Y-Z plane. A first surface (F1) and a second surface (F2) of an interposer (10M) with a metal foil are cutting planes.

By removing the metal foil 416 of an interposer (10M) with a metal foil, an interposer 10 can be manufactured from the interposer (10M) with a metal foil. When individual interposers 10 are manufactured by cutting, the interposers 10 may have small scratches. Due to the small scratches, the interposers 10 may deteriorate due to heat cycles. In contrast, according to the interposer with a metal foil, the metal foil 416 can suppress occurrence of small scratches. Therefore, the interposer (10M) with a metal foil and the interposer 10 manufactured by removing the metal foil 416 of the interposer (10M) with a metal foil are unlikely to deteriorate due to heat cycles.

The ends of the conductors 36 that are exposed from the first surface (F1) and the ends of the conductors 36 that are exposed from the second surface (F2) are removed by etching. As a result, the first electrodes (36D1) are recessed from the first surface (F1), and the second electrodes (36D2) are recessed from the second surface (F2). A protective film 72 can be formed on each of the first electrodes (36D1) and the second electrodes (36D2) (FIG. 7D).

As illustrated in FIG. 5A, by connecting the pads of the printed wiring board 110 and the conductors 36 of the interposer 10 using the solder bumps (176F), the interposer is mounted on the printed wiring board 110. By connecting the conductors 36 of the interposer 10 and electrodes of the semiconductor elements (290A, 290B) using the solder bumps 276, the multiple semiconductor elements (290A, 290B) are mounted on the interposer. An MCM package is formed.

Second Embodiment

FIG. 6A is a plan view of an interposer 10 of a second embodiment of the present invention. FIG. 5B is a cross-sectional view of an application example 1140 of the interposer 10 according to the second embodiment. The application example 1140 is formed by the printed wiring board 110 on which an electronic component 190, the interposer 10 having an opening 32, and the second printed wiring board 210 on which an electronic component 290 is mounted. Examples of the electronic components (190, 290) are semiconductor elements. An example of the electronic component 190 is an IC chip, and an example of the electronic component 290 is a memory. The electronic components are connected to the printed wiring boards (110, 210) using the solder bumps (176F) and wires 236.

The IC chip 190 is mounted on a substantially central portion of the printed wiring board 110. The opening 32 of the interposer 10 is an opening for accommodating the electronic component 190, and penetrates the interposer 10. The opening penetrates the insulating plate 3010. Further, as illustrated in FIG. 6A, the opening 32 is formed substantially at a center of the interposer 10. The opening 32 is formed substantially at a center of the insulating plate 3010.

The pads of the printed wiring board 110 and the conductors 36 of the interposer are connected using the solder bumps (176F). The conductors 36 of the interposer 10 and the pads of the second printed wiring board 210 are connected using the solder bumps 276.

In the second embodiment, the interposer 10 accommodates the IC chip 190 in the opening 32. Therefore, the thickness of the application example (POP module) 1140 can be reduced. The conductors 36 of the interposer 10 of the present embodiment are thin. Spacing between adjacent conductors 36 is small. The conductors 36 are provided at a high density. Therefore, even when the interposer 10 has the opening 32, data transmission is possible between the IC chip 190 and the memory 290 using the interposer of a small size. The interposer 10 of the second embodiment may also be an interposer (10M) with a metal foil.

The interposer 10 of the second embodiment is manufactured using substantially the same method as the interposer 10 of the first embodiment. In the second embodiment, the conductors 36 are not formed in a central portion of the interposer 10. The conductors 36 are formed only in an outer periphery region of the interposer 10. The insulating layers 301 in the central portion are removed by punching or using laser or using a router. Or, the interposer 10 of the second embodiment can be manufactured by removing a central portion of the interposer 10 of the first embodiment. By having the opening 32, the interposer of the second embodiment can easily release a stress. Further, an amount of contraction of the interposer 10 can be reduced. Stress acting on the conductors 36 can be reduced.

It is not necessary to manufacture an intermediate in order to manufacture an interposer. The interposer 10 can be manufactured by alternately laminating all of the insulating layers 301 and all of the conductor layers on a support plate. For example, a metal foil is laminated on a support plate. Thereafter, the first outermost insulating layer 3041 is laminated on the metal foil. Thereafter, the conductor layers 360 and the insulating layers 301 are alternately laminated. The lamination of the conductor layers and the insulating layers terminates when the second outermost insulating layer 3042 is laminated. Then, a metal foil is laminated on the second outermost insulating layer 3042. By removing the support plate, the interposer (10M) with a metal foil is manufactured. By removing the metal foil, the interposer 10 is manufactured.

The interposer 10 has conductors (conductors (A)) 36 that are each formed by an electrolytic plating film only and conductors (conductors (B)) 36 that are each formed by a seed layer and an electrolytic plating film on the seed layer. One conductor layer is formed by conductors (A) only. One conductor layer is formed by conductors (B) only. Physical properties of the seed layer and physical properties of the electrolytic plating film are different. Therefore, by forming the conductor layers formed by the conductors (A) and the conductor layers formed by the conductors (B), the strength and the thermal expansion coefficient of the interposer can be delicately adjusted. A stress in the interposer and warpage of the interposer are reduced. The interposer can be stable for a long period of time. Examples of the physical properties are the Young's modulus and the thermal expansion coefficient.

FIG. 8A illustrates one insulating layer 301 and two conductor layers 360 that sandwich the insulating layer 301. A dotted line (301D) is depicted in FIG. 8A. The dotted line (301D) indicates a boundary between the inter-conductor-layer insulating layer (301A) and the inter-conductor insulating layer (301B). The inter-conductor-layer insulating layer (301A) has the reinforcing material (RM). The reinforcing material (RM) is in contact with an upper surface of a conductor 36. Movement of the conductor is suppressed and thus reliability of connection via the conductor 36 is increased.

The interposer (10M) with a metal foil may also have a metal foil on a surface (side surface) other than the first surface (F1) and the second surface (F2). The metal foil is formed on the third surface (F3) and the fourth surface (F4). Or, the metal foil is formed on the four side surfaces (F3, F4, F5, F6) other than the first surface (F1) and the second surface (F2). The side surfaces (F3, F4, F5, F6) are illustrated in FIG. 1A. The side surface (F3) and the third surface (F3) are the same surface. The side surface (F4) and the fourth surface (F4) are the same surface. The side surface (F5) and the side surface (F6) are perpendicular to the first surface (F1). The side surface (F5) and the side surface (F6) opposed each other.

In the present embodiment, the conductors 36 are formed using a plating resist. The thin conductors 36 can be manufactured. The pitch between the conductors 36 can be reduced. It is difficult to form the same conductors as in the present embodiment by filling through holes with plating. This is because it is difficult to fill through holes without forming voids when diameters of the through holes are small. When the conductors 36 contain voids, reliability of the conductors 36 is reduced. In the present embodiment, the conductors 36 that do not contain voids can be provided.

In the second embodiment, the interposer 10 and the interposer (10M) with a metal foil may have the distances (K1, K2, K3, K4) illustrated in FIG. 7D.

In a relay substrate of a laminated structure, conductor posts may penetrate multiple insulating layers. Even when the insulating layers of the relay substrate are formed of the same material, it is likely to be extremely difficult for adjacent insulating layers to have the same physical properties. Therefore, when the relay substrate is subjected to heat cycles, a stress is likely to accumulate at an interface between adjacent insulating layers. The conductor posts pass through the interfaces between adjacent insulating layers. For example, when a distance between adjacent conductor posts is small, the conductor posts may be thin. When the conductor posts are thin, an impact of a stress is likely to increase. Therefore, when the conductor posts are thin, reliability of connection via the conductor posts is expected to decrease, and it is likely to be difficult to reduce the distance between adjacent conductor posts.

An interposer according to an embodiment of the present invention includes: an insulating plate that is formed by multiple insulating layers and has a first surface, a second surface, a third surface and a fourth surface, the second surface being on an opposite side of the first surface, the third surface being perpendicular to the first surface, the fourth surface being on an opposite side of the third surface, and the insulating layers being laminated on the third surface; and multiple conductor layers that are each sandwiched by adjacent insulating layers, and each have multiple substantially straight conductors that each extend from a first electrode exposed from the first surface to a second electrode exposed from the second surface. The insulating layers that are each sandwiched by adjacent conductor layers include second insulating layers that are each formed by an inter-conductor-layer insulating layer and an inter-conductor insulating layer, the inter-conductor-layer insulating layer being formed between adjacent conductor layers, and the inter-conductor insulating layer being formed between adjacent conductors in one conductor layer. The inter-conductor-layer insulating layer and the inter-conductor insulating layer are integrally formed.

An interposer according to an embodiment of the present invention can reduce a distance between adjacent conductors and provide a high-density interposer. Reliability of connection via the conductors is unlikely to decrease due to heat cycles. An interposer and a circuit substrate having high connection reliability can be provided.

Obviously, numerous modifications and variations of the present invention are possible in light of the above teachings. It is therefore to be understood that within the scope of the appended claims, the invention may be practiced otherwise than as specifically described herein.

The invention claimed is:

1. An interposer, comprising:
   an insulating plate comprising a plurality of insulating layers and having a first surface, a second surface, a third surface and a fourth surface such that the second surface is on an opposite side of the first surface, the third surface is perpendicular to the first surface, the fourth surface is on an opposite side of the third surface, and the plurality of insulating layers is laminated on the third surface; and
   a plurality of conductor layers formed in the insulating plate such that each of the conductor layers is interposed between adjacent insulating layers and comprises a plurality of straight conductors having a plurality of first electrode portions exposed from the first surface at one ends and a plurality of second electrode portions exposed from the second surface at opposite ends, respectively,
   wherein the plurality of insulating layers includes a plurality of second insulating layers each sandwiched by adjacent conductor layers such that each of the second insulating layers integrally has an inter-conductor-layer insulating layer portion formed between the adjacent conductor layers and a plurality of inter-conductor insulating layer portions formed between adjacent straight conductors in a respective one of the conductor layers.

2. An interposer according to claim 1, wherein each of the second insulating layers is formed such that a single resin film has the inter-conductor-layer insulating layer portion and the plurality of inter-conductor insulating layer portions.

3. An interposer according to claim 2, wherein the insulating plate has an opening portion penetrating through a center portion of the insulating plate such that the opening portion accommodates an electronic component.

4. An interposer according to claim 2, wherein each of the straight conductors has a cross-section which has substantially a rectangular shape and has sides each having a length in a range of 50 µm or more and 80 µm or less.

5. An interposer according to claim 2, wherein the plurality of conductor layers is formed such that the straight conductors are arrayed at intersection points of first straight lines and second straight lines intersecting each other at a substantially right angle.

6. An interposer according to claim 2, wherein the plurality of conductor layers is formed such that the straight conductors include a plurality of the straight conductors arrayed at intersection points of first straight lines and second straight lines intersecting each other at a substantially right angle, and a plurality of the straight conductors positioned at substantially center portions of rectangular divisions defined by the first straight lines and second straight lines, respectively.

7. An interposer according to claim 2, wherein the plurality of conductor layers is formed such that the first electrode portions of the straight conductors are recessed from the first surface of the insulating plate.

8. An interposer according to claim 2, wherein the plurality of conductor layers is formed such that the second electrode portions of the straight conductors are recessed from the first surface of the insulating plate.

9. An interposer according to claim 2, further comprising:
   a plurality of protective films formed on the plurality of first electrode portions and plurality of second electrode portions, respectively.

10. An interposer according to claim 1, wherein the insulating plate has an opening portion penetrating through a center portion of the insulating plate such that the opening portion accommodates an electronic component.

11. An interposer according to claim 1, wherein each of the straight conductors has a cross-section which has substantially a rectangular shape and has sides each having a length in a range of 50 µm or more and 80 µm or less.

12. An interposer according to claim 1, wherein the plurality of conductor layers is formed such that the straight conductors are arrayed at intersection points of first straight lines and second straight lines intersecting each other at a substantially right angle.

13. An interposer according to claim 1, wherein the plurality of conductor layers is formed such that the straight conductors include a plurality of the straight conductors arrayed at intersection points of first straight lines and second straight lines intersecting each other at a substantially right angle, and a plurality of the straight conductors positioned at substantially center portions of rectangular divisions defined by the first straight lines and second straight lines, respectively.

14. An interposer according to claim 1, wherein the plurality of conductor layers is formed such that the first electrode portions of the straight conductors are recessed from the first surface of the insulating plate.

15. An interposer according to claim 1, wherein the plurality of conductor layers is formed such that the second electrode portions of the straight conductors are recessed from the first surface of the insulating plate.

16. An interposer according to claim 1, further comprising:
   a plurality of protective films formed on the plurality of first electrode portions and plurality of second electrode portions, respectively.

17. An interposer according to claim 1, wherein the plurality of insulating layers comprises resin material and reinforcing material and is formed such that the plurality of conductor layers is not penetrating through the reinforcing material of the insulating layers.

18. An interposer according to claim 1, wherein each of the insulating layers comprises a single insulating layer.

19. An interposer according to claim 1, wherein the plurality of conductor layers is formed such that the plurality of conductor layers is not penetrating through the insulating layers.

20. A circuit substrate, comprising:
   a printed wiring board; and
   the interposer of claim 1 mounted on the printed wiring board.

* * * * *